United States Patent
Lin et al.

(10) Patent No.: US 7,732,877 B2
(45) Date of Patent: Jun. 8, 2010

(54) GATED DIODE WITH NON-PLANAR SOURCE REGION

(75) Inventors: Da-Wen Lin, Taiping (TW); Ying-Shiou Lin, Hsin-Chu (TW); Shyh-Wei Wang, Hsin-Chu (TW); Li-Ping Huang, Taipei (TW); Ying-Keung Leung, Hsinchu (TW); Carlos H. Diaz, Mountain View, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 225 days.

(21) Appl. No.: 11/731,963

(22) Filed: Apr. 2, 2007

(65) Prior Publication Data
US 2008/0237746 A1 Oct. 2, 2008

(51) Int. Cl.
*H01L 29/772* (2006.01)
*H01L 21/336* (2006.01)

(52) U.S. Cl. .............. 257/409; 257/288; 257/E29.039; 257/E29.131; 257/E29.195; 257/E29.279; 438/286; 438/300

(58) Field of Classification Search ................. 257/213, 257/409, 401, 288, E29.255, E29.027–E29.028, 257/E29.039, E29.131, E29.04, E29.195, 257/E29.279; 438/286, 300
See application file for complete search history.

(56) References Cited

U.S. PATENT DOCUMENTS

| | | | | |
|---|---|---|---|---|
| 5,956,590 A | * | 9/1999 | Hsieh et al. | 438/303 |
| 6,825,528 B2 | * | 11/2004 | Iwata et al. | 257/336 |
| 7,170,130 B2 | * | 1/2007 | Fang et al. | 257/316 |
| 7,355,262 B2 | * | 4/2008 | Ko et al. | 257/506 |
| 2003/0089932 A1 | | 5/2003 | Iwata et al. | |
| 2006/0033128 A1 | * | 2/2006 | Chi | 257/279 |
| 2007/0090408 A1 | * | 4/2007 | Majumdar et al. | 257/213 |

* cited by examiner

*Primary Examiner*—Zandra Smith
*Assistant Examiner*—Jeremy J Joy
(74) *Attorney, Agent, or Firm*—Slater & Matsil, L.L.P.

(57) ABSTRACT

A gated-diode semiconductor device or similar component and a method of fabricating the device. The device features a gate structure disposed on a substrate over a channel and adjacent a source and a drain. The top of the source or drain region, or both, are formed so as to be at a higher elevation, in whole or in part, than the bottom of the gate structure. This configuration may be achieved by overlaying the gate structure and substrate with a profile layer that guides a subsequent etch process to create a sloped profile. The source and drain, if both are present, may be symmetrical or asymmetrical. This configuration significantly reduces dopant encroachment and, as a consequence, reduces junction leakage.

8 Claims, 19 Drawing Sheets

GATED DIODE WITH NON-PLANAR SOURCE REGION

TECHNICAL FIELD

The present invention relates generally to semiconductor devices, and more particularly to a gated diode having a non-planar source region or source and drain region.

BACKGROUND

There are many types of semiconductor electronic devices. Such devices, for example diodes and transistors, take advantage of the semiconducting nature of certain materials. Because of their various advantages, they have been steadily replacing conventional electrical parts in many applications over the last half century. Some of the advantages of semiconductor devices and circuits include their low cost, small size, and generally good reliability. They are especially suited for computing and memory operations and appliances using them have become ubiquitous. Personal computers, mobile telephones, and media players are just a few examples of applications that make use of semiconductor devices.

A semiconductor is a material that may be induced to act as either a conductor or as a non-conductor in a generally-controllable manner. Typical semiconductor materials include silicon, germanium, or combinations of the two that have been subject to a process known as ion implantation. Ion implantation, sometimes called 'doping', involves bombarding a semiconductor material, with ions of various elements such as boron and phosphorus. Using these two elements creates two different types of semiconductor materials, sometimes referred to as p-type and n-type, respectively. The basic difference between types of semiconductor materials involves their behavior under certain conditions, and specifically how they conduct electricity when properly induced. Selective ion implantation creates regions of these different types in the same piece of semiconductor material, often in this context called a substrate, and these regions may then be connected electrically to create a circuit. In general, the application of a certain stimulus, most often a small electrical charge, causes electrical current to flow in a predictable manner through and across the boundary between these regions. This allows, for example, the formation of switches and capacitors that have no moving parts.

A simple exemplary semiconductor device is shown in FIG. 1. FIG. 1 is a simplified block diagram illustrating a typical semiconductor diode 10. Diode 10 consists of a region of p-type semiconductor material 12 (sometimes called an anode) that is immediately adjacent to a region of p-type semiconductor material 14 (or cathode), the two regions meeting at p-n junction 13. The two regions are, in this example, portions of a larger silicon substrate (the remainder of which is not shown) that are formed by being separately implanted with boron and phosphorus ions, a process also known as doping. Contacts 11 and 15 have been couple to the p-type silicon 12 and the n-type silicon 14 so an electrical charge may be applied. When a forward bias, that is, a positive charge is applied to the anode, current flows across the p-n junction 13. Current will not flow in the opposite direction, however, even if the bias is reversed, giving the diode 10 its useful characteristic behavior.

A more sophisticated diode is illustrated in FIG. 2. FIG. 2 is a cross-sectional view illustrating a typical semiconductor gated diode 20. The gated-diode is so-called because it includes a gate structure that can be used to moderate the device's behavior. In this example, gated diode 20 includes a gate structure 25 that has been formed on substrate 21. Gate structure 25 includes a gate electrode 26 that is separated from the substrate 21 by a dielectric layer 27. The gate electrode 26 is made of a conducting material such as polysilicon or a metal, the gate dielectric 27 may be, for example, an oxide or nitride of silicon.

The substrate 21 in this example is made of a p-type material. In it have been formed regions of n-type material, referred to here as a source 22 and a drain 23. Source 22 and drain 23 define a channel 24 beneath the gate structure 25. In a transistor of similar design, such as a MOSFET (metal oxide semiconductor field effect transistor) the source and drain regions would be connected to different components, but in the MOS gated diode 20 they are coupled together as shown in FIG. 2. A separate lead is attached the gate electrode 26 so that a gate voltage Vg may be applied. The substrate 21, of course, serves as a ground. Note that because this device has structural similarities to a MOSFET, it may sometimes herein also be referred to as a MOSFET gated diode.

Like any electrical device, MOSFET gated diodes do not always function perfectly. One of the more significant problems encountered with devices such as the gated diode of FIG. 2 is junction leakage. Junction leakage is undesirable current flow, for example when in the reverse-bias or some other condition in which current flow is not supposed to occur. One solution has been use lower doping concentrations in the source and drain regions. Unfortunately, this can lower driving current and reduce overall device performance. Undesirable junction capacitance is also sometimes a problem.

As alluded to above, the electronic devices made of semiconductor materials are very small. Advances in fabrication technology, in fact, now enable the manufacture of chips, or separable sections of semiconductor wafers that are thin squares or rectangles much less than one centimeter on a side yet include over a million transistors, diodes, and other devices. The gate diode 20 of FIG. 2, for example, may be less than 100 microns wide and have a channel length (from the source region to the drain region) of less than 25 microns. As should be apparent, fabricating such small devices poses many challenges. In addition, the very short channel tends to give rise to the existence of undesirable 'short channel effects' (SCE), where the device does not behave in an ideal manner. At the same time, demand for even smaller devices is constantly driving designs, so that even small chips can be produced. It therefore becomes imperative to eliminate or at least minimize the unwanted SCEs and other similar problems.

Needed, then, is a gated-diode that can be fabricated in a small enough size to be useful in today's electronics devices without having to excessively lower the source and drain region doping concentration in order to prevent junction leakage.

SUMMARY OF THE INVENTION

These and other problems are generally solved or circumvented, and technical advantages are generally achieved, by preferred embodiments of the present invention which are directed to producing a semiconductor device such as a gated diode that has an optimum doping profile resulting from a non-planar source or source and drain configuration.

In one aspect, the present invention is a semiconductor device, that includes a substrate and a gate structure disposed on the substrate in such a manner that the gate structure lower boundary is lower than the upper boundary, or at least part of the upper boundary, of the source region or the source and drain region adjacent to the gate structure. One or both of the source and drain regions preferably has a sloping profile, thought the source and drain region may or may not be symmetrical about the gate structure. The difference in elevation may be achieved by a recessed channel region or by raising the substrate in the vicinity of the gate structure, for example by epitaxial growth.

In another aspect, the present invention is a method of fabricating a semiconductor device including the steps of providing a substrate, forming a gate structure on the substrate, the gate structure having a lower boundary adjacent to the substrate, and forming a source region having a sloping upper boundary adjacent to the gate structure, wherein at least a portion of the upper boundary is higher than the gate structure lower boundary. The source region upper boundary is preferably though not necessarily downward sloping, and may be formed in part by in-situ epitaxial growth on the original substrate. The sloping upper boundary may be formed using a profiling layer of, for example, an oxide or a photoresist material, and etched using a dry etch process. A drain region opposite the source region may be formed in similar fashion and have a profile that is either symmetrical or asymmetrical with respect to the source region. If the drain region is present, it may be formed simultaneously with the source region, but may be formed separately as well. A second profiling layer may be used in some embodiments.

An advantage of a preferred embodiment of the present invention is that it reduces dopant encroachment or lateral scattering, and therefore lowers the maximum electric field and reduces junction leakage.

A further advantage of a preferred embodiment of the present invention is that it enables the production of high threshold-voltage devices having reduced junction leakage.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention provides a gated-diode or similar semiconductor device having improved SCE (short channel effect) characteristics, and a reduced junction current leakage over prior art devices. The reduction in junction leakage results in part because the device of the present invention permits a reduced electric field at a given DIBL (drain induced barrier lowering) level. Undesirable junction capacitance is also reduced. To illustrate the new features that lead to this improvement, a typical device of the prior art will first be introduced for the purposes of comparison.

Figure 1:
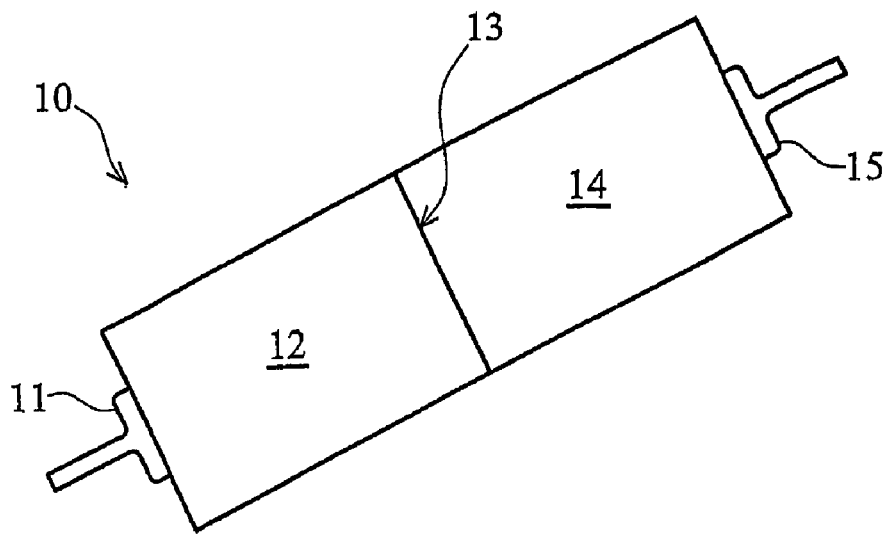
FIG. 1 is a simplified block diagram illustrating a typical semiconductor diode.
Figure 2:
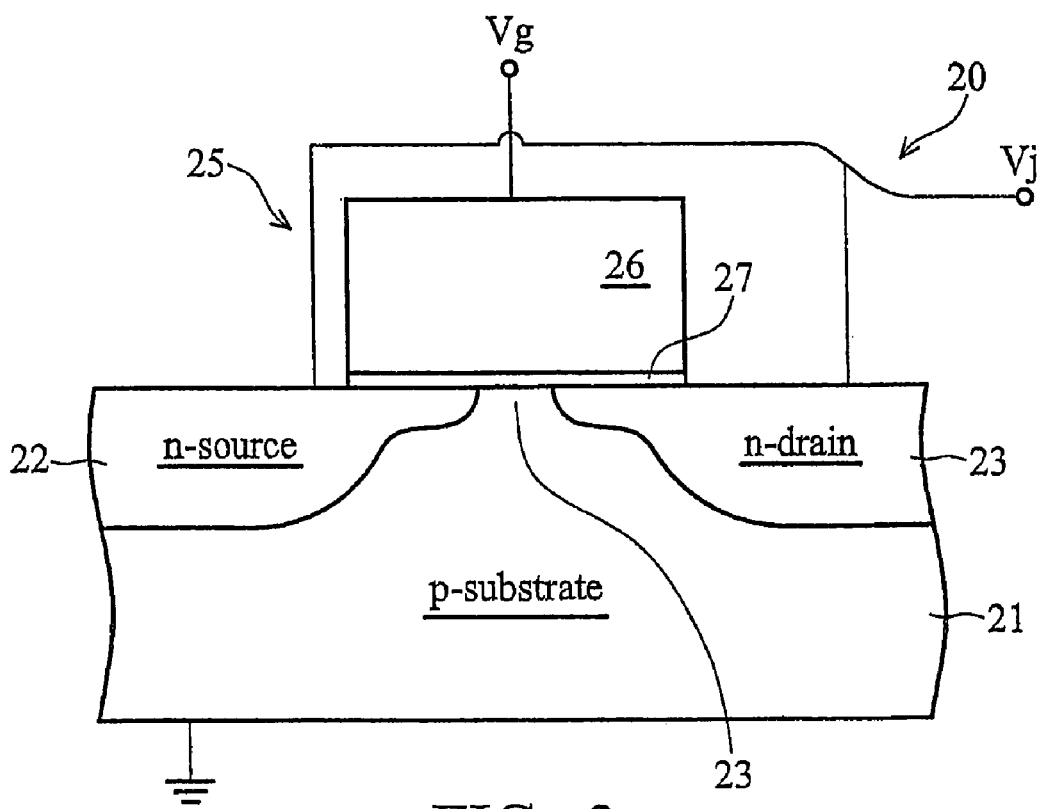
FIG. 2 is a cross-sectional view illustrating a typical semiconductor gated diode.
Figure 3:
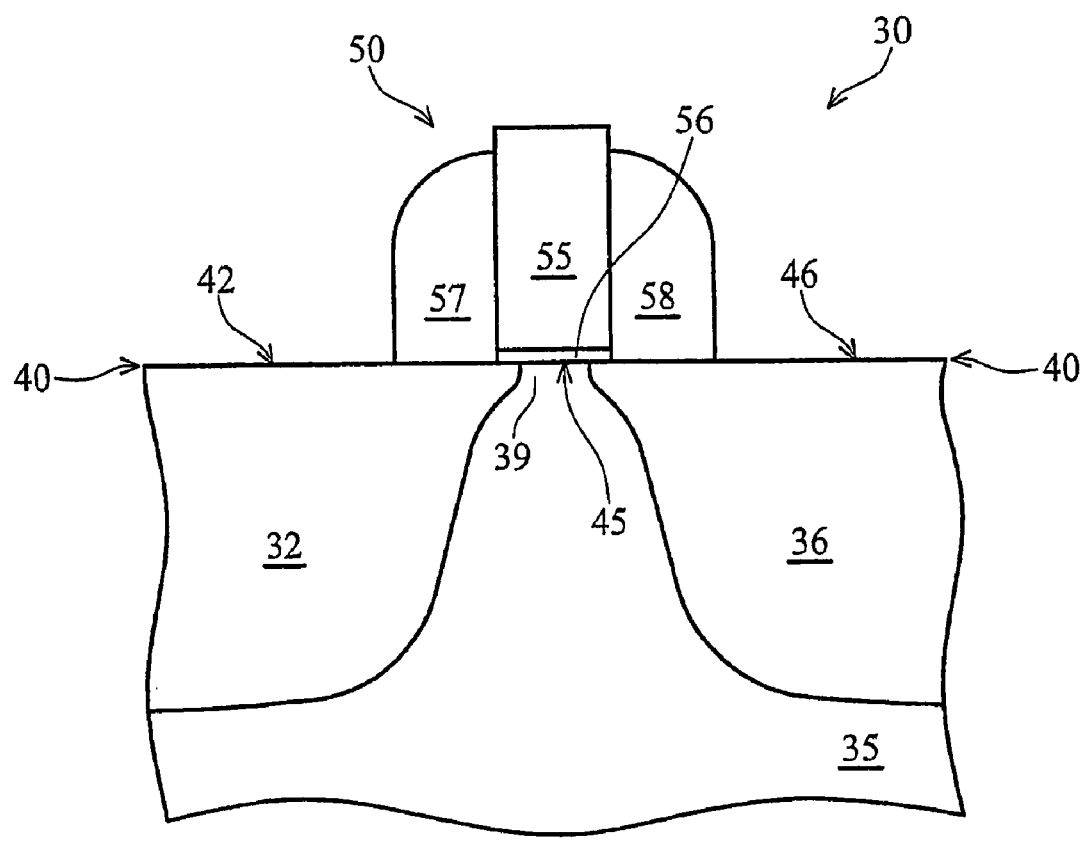
FIG. 3 is a cross-sectional side view of a typical gated diode semiconductor device according to the prior art.

FIG. 3 is a cross-sectional side view of a typical gated-diode semiconductor device 30 of the prior art. The device 30 is fabricated on, and in fact includes portions of a substrate 35. The substrate may again be a silicon wafer or some other suitable material. Upon the top surface 40 of substrate 35 has been fabricated a gate structure 50. Gate structure 50 includes a gate electrode 55 that is physically separated from substrate 35 by a dielectric layer 56. Dielectric layer is, for example, made of silicon dioxide, but could be formed from other, different materials as well. On either side of the gate electrode is a spacer, referred to in FIG. 3 as spacer 57 and spacer 58. Spacers 57 and 58 are also formed of one or more layers of material (not separately shown), at least one of which is a dielectric. Formed in the substrate itself are a source region 32 and a drain region 36. The source region 32 and the drain region 36 are typically formed by selective ion implantations, and define a channel region 39. It is noted that the source and drain regions shown here each comprise a deep main portion and a shallow extension, although these are not separately referred to in FIG. 3. Electrical connections may be made (but are not shown in FIG. 3) such that the device may be used as a transistor or as a gated diode. Other applications to create various devices may be possible as well.

In the device 30 of FIG. 3, the upper boundary 42 of the source region 32 and the upper boundary 46 of the drain region 36 are, in the semiconductor device 30, coplanar with respect to each other, and with respect to the lower boundary 45 of the gate structure 50. This is a typical configuration and for convenience herein will be referred to as a planar source and drain configuration. The planar source and drain configuration naturally result in the p-n junctions profile shown in FIG. 3, though these profiles may vary somewhat according to the doping ion concentration. It has been found, however, that the p-n junctions may be advantageously changed by altering the configuration of the source or of the drain, or both, relative to the lower boundary of the gate structure. The configuration of the present invention will now be explained in more detail, with reference to FIGS. 4 through 10f.

Figure 4:
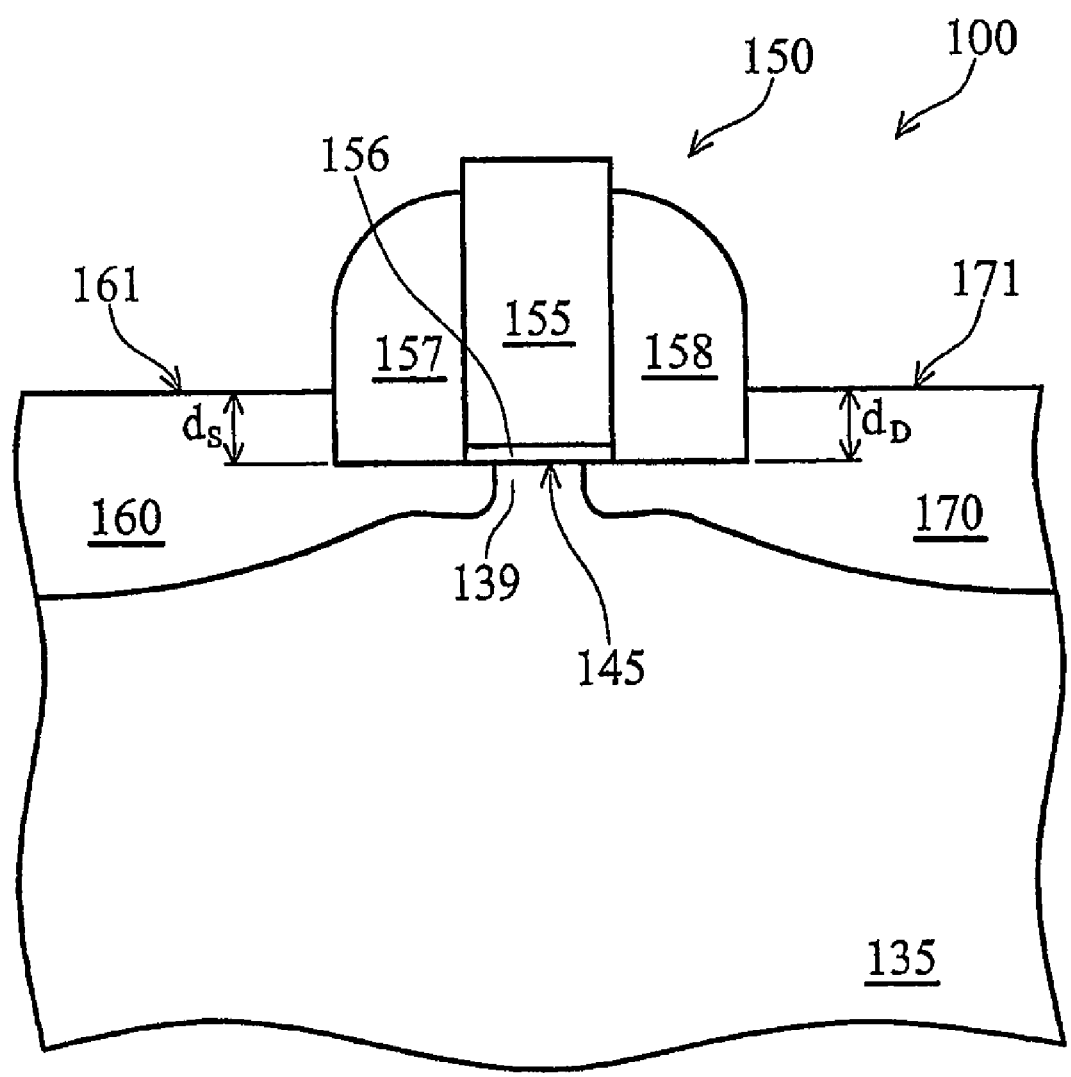
FIG. 4 is a cross-sectional side view of a gated-diode semiconductor device according to an embodiment of the present invention.

FIG. 4 is a cross-sectional side view of a gated-diode semiconductor device 100 according to an embodiment of the present invention. Some of the features in semiconductor device are similar to those in the baseline device of FIG. 3, and will be numbered analogously. Gate structure 150 includes gate electrode 155, gate dielectric 156, and spacers 157 and 158. Gate structure 150 is disposed on substrate 135, and has a lower boundary 145. In this embodiment of the present invention, however, the upper boundary 161 of source region 160 is raised above the lower boundary 145 of gate structure 150 by the dimension $d_S$, representing the vertical distance between the gate-structure lower boundary 145 and the highest elevation of the source-region upper boundary 161. In one preferred embodiment, illustrated in FIG. 4, the dimension $d_S$ is about 200 Å. As should be apparent, the upper boundary 161 of source region 160 is substantially horizontal. In an alternate embodiment, not shown in FIG. 4, the upper boundary 161 may slope up or down as the distance from gate structure 150 increases.

Note that the terms horizontal and vertical apply with reference to the device orientation shown in FIG. 4. In this embodiment, the lower boundary 145 of the gate structure 150 is substantially horizontal, as is usually though not necessarily the case. Some deviation from a "true" horizontal or vertical may, of course, occur in actual fabrication. Where a non-horizontal gate lower boundary is present, by design or as the result of fabrication tolerances, the dimensions $d_S$ and $d_D$ may be calculated with reference to the nearest edge of the gate-structure lower boundary 145.

As should also be apparent from FIG. 4, the dimension $d_D$, representing the vertical distance between the gate-structure lower boundary 145 and the highest elevation of the upper boundary 171 of drain region 170, is substantially equal to the dimension $d_S$. The symmetrical, flat non-planar source and drain configuration has been found to result in a more favorable p-n boundary profile, as compared to the baseline profile of FIG. 3, when associated with about the same ion doping concentration. This in effect means that there is less dopant encroachment from the implantation process, lessening problematic short channel effects. A lower channel dose is required, and the electric field necessary at a given DIBL (drain-induced barrier lowering) level is reduced. The need for a pocket implant is reduced or eliminated. For this reason, gated-diode junction leakage is also reduced. Note, however, that no specific result is required unless explicitly claimed.

Figure 5:
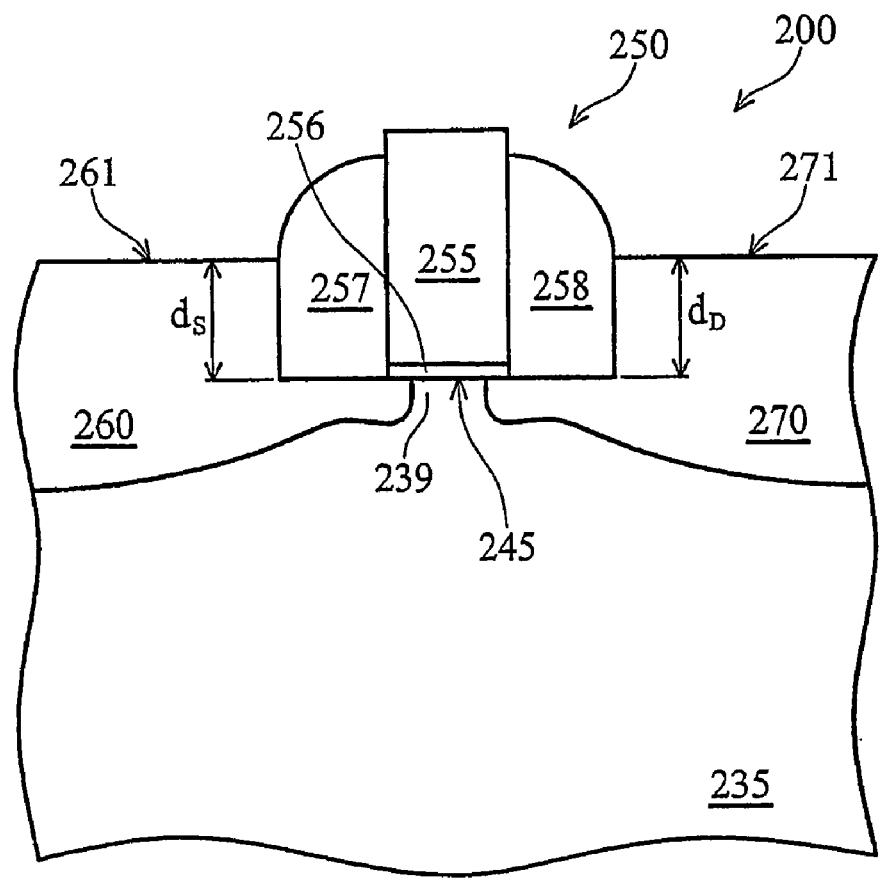
FIG. 5 is a cross-sectional side view of a gated-diode semiconductor device according to another embodiment of the present invention.

FIG. 5 is a cross-sectional side view of a gated-diode semiconductor device 200 according to another embodiment of the present invention. The features of the semiconductor device 200 of FIG. 5 that are similar to those of the device 100 of FIG. 4 are analogously numbered, and will be discussed again only as needed to clearly and conveniently explain this embodiment. As should also be apparent, semiconductor device 200 of FIG. 5 also features a symmetrical, flat non-planar source and drain configuration. In this embodiment, however, the dimensions $d_S$ and $d_D$ are about 400 Å. The p-n junction profile is correspondingly adjusted, and the improvement encountered in SCE performance is similar to that of the device 100 of FIG. 4, but may be more pronounced. In the absence of other contraindicating factors, the embodiment of FIG. 5 is the preferred embodiment of the two.

Figure 6:
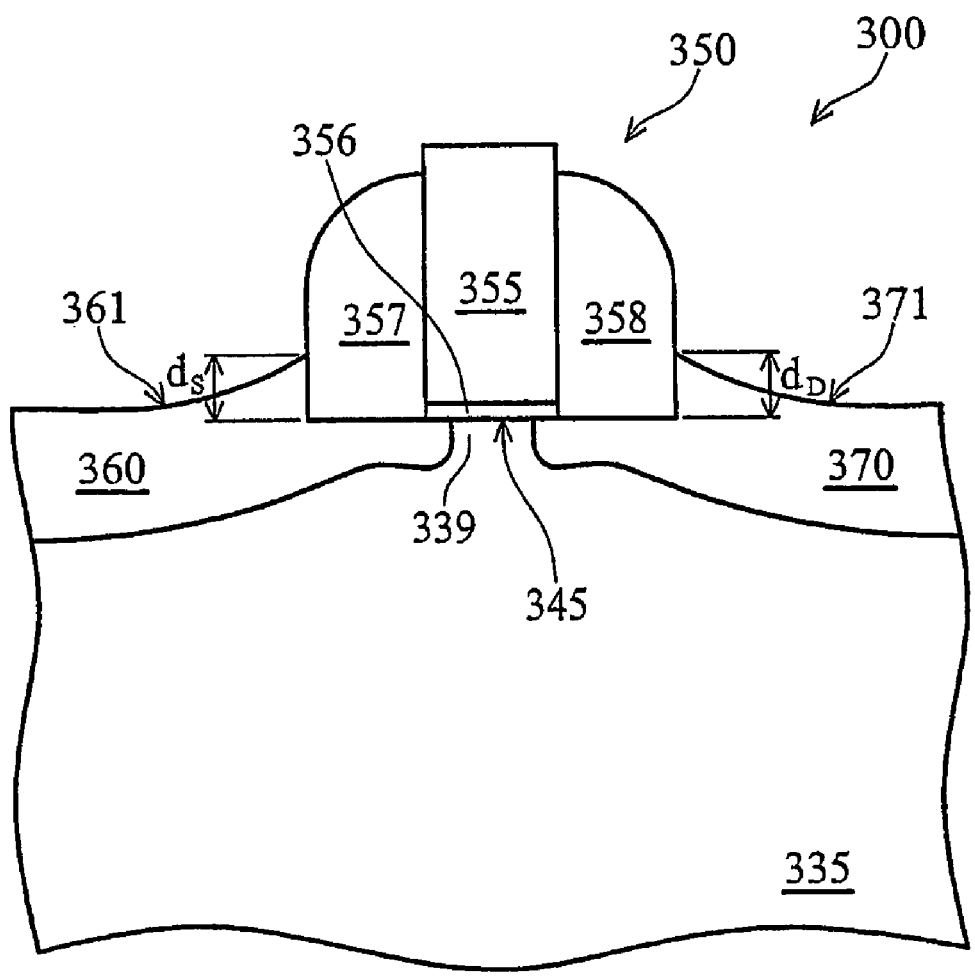
FIG. 6 is a cross-sectional side view of a gated-diode semiconductor device according to another embodiment of the present invention.

FIG. 6 is a cross-sectional side view of a gated-diode semiconductor device 300 according to another embodiment of the present invention. In this embodiment, a non-planar source region and drain region are also featured. The dimensions $d_S$ and $d_D$ are both about 200 Å, as is the case with the embodiment 100 of FIG. 3. In the embodiment of FIG. 6, however, the upper boundary 361 of the source region 360 and the upper boundary 371 of the drain region 370 are highest on one end of the horizontal dimension and lowest on the other. In both the source region 360 and the drain region 370, the highest point in the embodiment is at or near the gate structure. This configuration will be said to be downward sloping. Note that as used herein, downward refers to an upper boundary that decreases in elevation as the distance from the gate structure increases. In other embodiments (not shown) one or both of the source region and the drain region may have an upward-sloping upper boundary, or one having a slope that changes direction, although these other embodiments are not presently preferred. In accordance with the previously-established convention. The source region and the drain region, which both have downward sloping upper boundaries, are referred to as symmetrical because they both slope downward in substantially the same fashion as the distance from the gate structure increases. In one embodiment, for example, the upper boundaries of the source region 360 and the drain region 370 each slope at an angle of about 15° to the horizontal, that is, relative to the surface of the substrate 335 at the lower boundary 345 of gate structure 350. The configuration of FIG. 6 also referred to as non-planar because the respective upper boundaries of the source region and the drain region are not co-planar with the lower boundary of the gate structure.

The configuration of device 300 has been determined to produce the p-n junction profile shown in FIG. 6. This has been found to produce favorable results compared not only with the baseline semiconductor device, but also the non-planar source and drain configuration of FIGS. 3 and 4.

Figure 7:
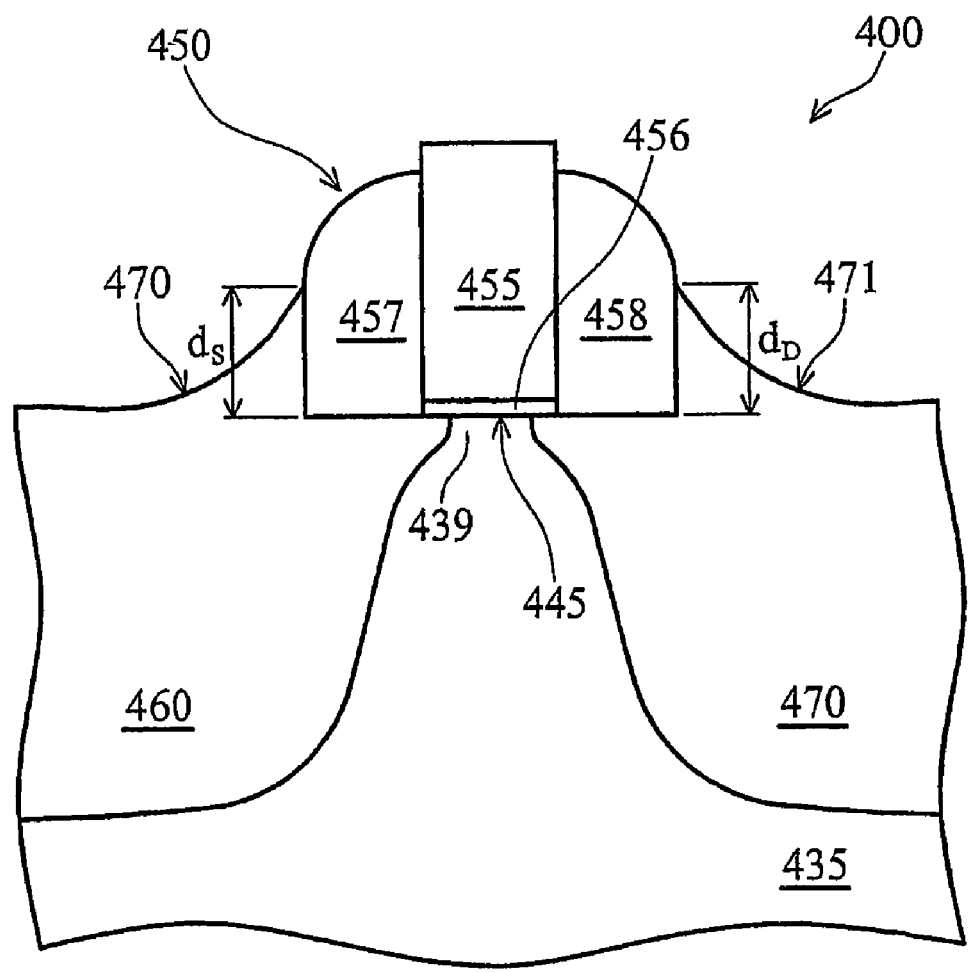
FIG. 7 is a cross-sectional side view of a gated-diode semiconductor device according to another embodiment of the present invention.

FIG. 7 is a cross-sectional side view of a gated-diode semiconductor device 400 according to another embodiment of the present invention. In the embodiment of FIG. 7, a non-planar solution is again featured. As with the embodiment of FIG. 5 the upper boundary of the source region and the upper boundary of the drain region are at approximately the same elevation and occur at or near the junction of the gate structure with the respective source or drain region. In this embodiment, however, the dimensions $d_S$ and $d_D$ are both about 400 Å. This dimension increase results in a p-n junction profile similar to that of the embodiment of FIG. 6, but may be more pronounced. The improvement in SCE characteristics has been found to correspondingly be greater. In many applications this embodiment may be preferred.

Figure 8:
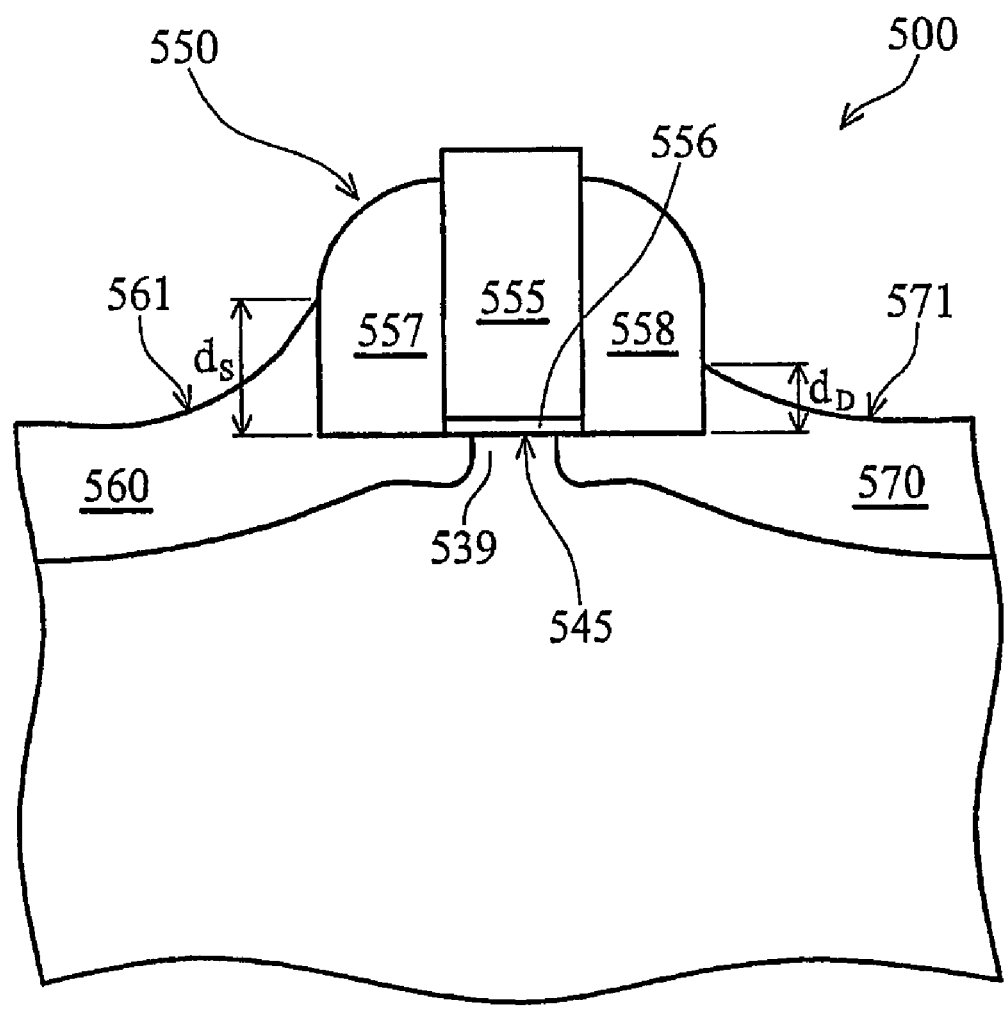
FIG. 8 is a cross-sectional side view of a gated-diode semiconductor device according to another embodiment of the present invention.

Other configurations are possible, of course, for example the asymmetrical configuration of FIG. 8. FIG. 8 is a cross-sectional side view of a gated-diode semiconductor device 500 according to another embodiment of the present invention. As should be apparent, in the embodiment of FIG. 8 the source region and the drain region are again non-planar with respect to the lower boundary of the gate structure. In this embodiment, however, they are also non-planar with respect to each other as well, and the configuration is therefore asymmetric. In this embodiment, the dimension $d_S$, associated with the upper boundary 561 of the source region 560 is about 400 Å; while the dimension $d_D$ associated with the upper boundary 571 of drain region 570 is about 200 Å. In other embodiments of the present invention (not shown), one of the source or drain regions may be flat and the other tapered in a configuration where $d_S$ and $d_D$ may be the same or may be different. By the same token, in still other embodiments (also not shown), one of the source and the drain may be planar, while the other is non-planar (again, with respect to the lower boundary of the gate structure). The gate structure itself may also be varied in a number of ways, and other types of devices may be formed with the resulting structure.

Note that the embodiment of FIG. 8 is not presently preferred, in part because it may in some cases present additional difficulties in the fabrication process that do not outweigh any advantages it may have in a particular application. The embodiment of FIG. 8 does serve to illustrate, however, that the non-planarity of the source and drain regions need not be identical, if asymmetry is judged to be superior or necessary.

By the same token, it is not necessary that the highest elevation of the upper boundary of the source region or of the drain region occur at or near the gate structure, although this configuration is presently preferred. Nor is it necessary that the source region and the drain region have their highest elevations at analogous points. Finally, in the gated-diode semiconductor device, drain region is not entirely necessary, and a single p-n junction device may be used in some applications.

Figure 9A:
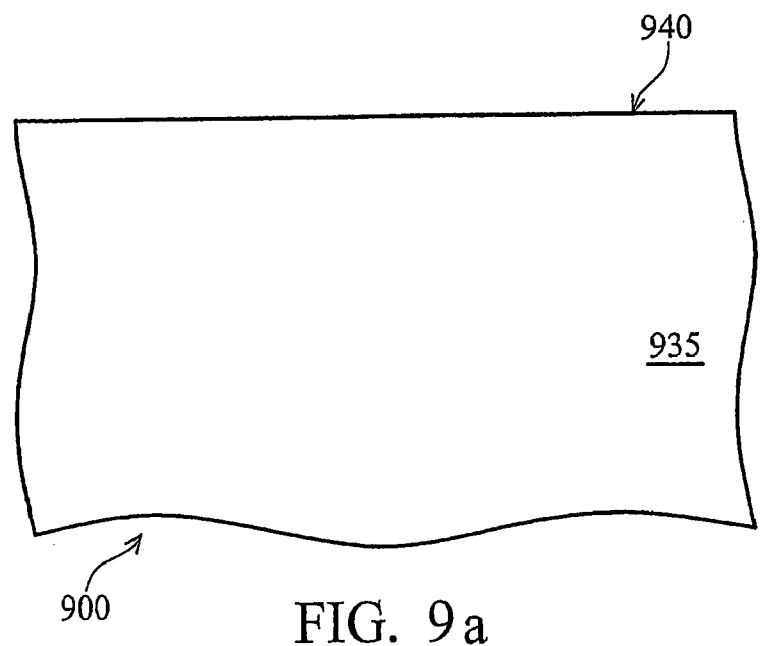
FIGS. 9a through 9g are a series of cross-sectional side views illustrating a gated-diode semiconductor device at selected stages of fabrication according to an embodiment of the present invention.

Whatever embodiment is selected, the manner of fabricating the semiconductor device will be different from those previously-known in the art. Exemplary methods according the present invention will therefore now be described. FIGS. 9a through 9g are a series of cross-sectional side views illustrating a gated-diode semiconductor device 900 at selected stages of fabrication according to an embodiment of the present invention. FIG. 9a illustrates a cross-sectional view of a substrate 935; which may be a wafer of silicon or some other suitable material. A tensile or compressive stress material, such as silicon germanium, may also be used. This wafer, usually a thin piece sliced from a larger ingot of the material, has been provided with a relatively large, flat surface 940 on which the various semiconductor devices are to be fabricated (utilizing, in fact, portions of the substrate material itself in the process). Note that this view represents a very small portion of the entire wafer, on which millions of devices such a semiconductor device 900 may be fabricated.

Figure 9B:
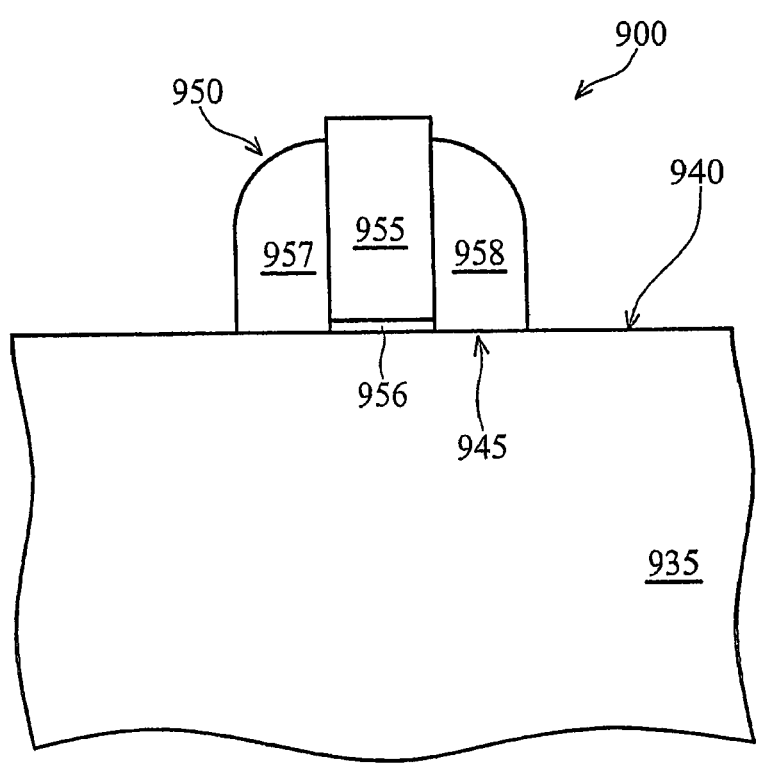

In this embodiment, a gate structure is then fabricated on the surface of the substrate, as shown in FIG. 9b. Fabricating the semiconductor device 900 to this stage typically takes several steps that are generally known in the art, and are therefore not separately illustrated. Generally speaking, however, the formation of gate structure 950 involves the deposition of various layers of material and selectively etching away unwanted portions of it. The source and drain regions may be created by ion implantation. There are a number of variations on the basic process that may be employed, and no one specific process for gate-structure formation is required unless explicitly recited. As can be seen in FIG. 9b, the upper boundary 945 of the areas that will become the source region and the drain region are flat, and in fact coincidental with the surface 940 of the substrate 935. They are also each substantially coplanar with respect to the lower boundary of the gate structure.

Figure 9C:
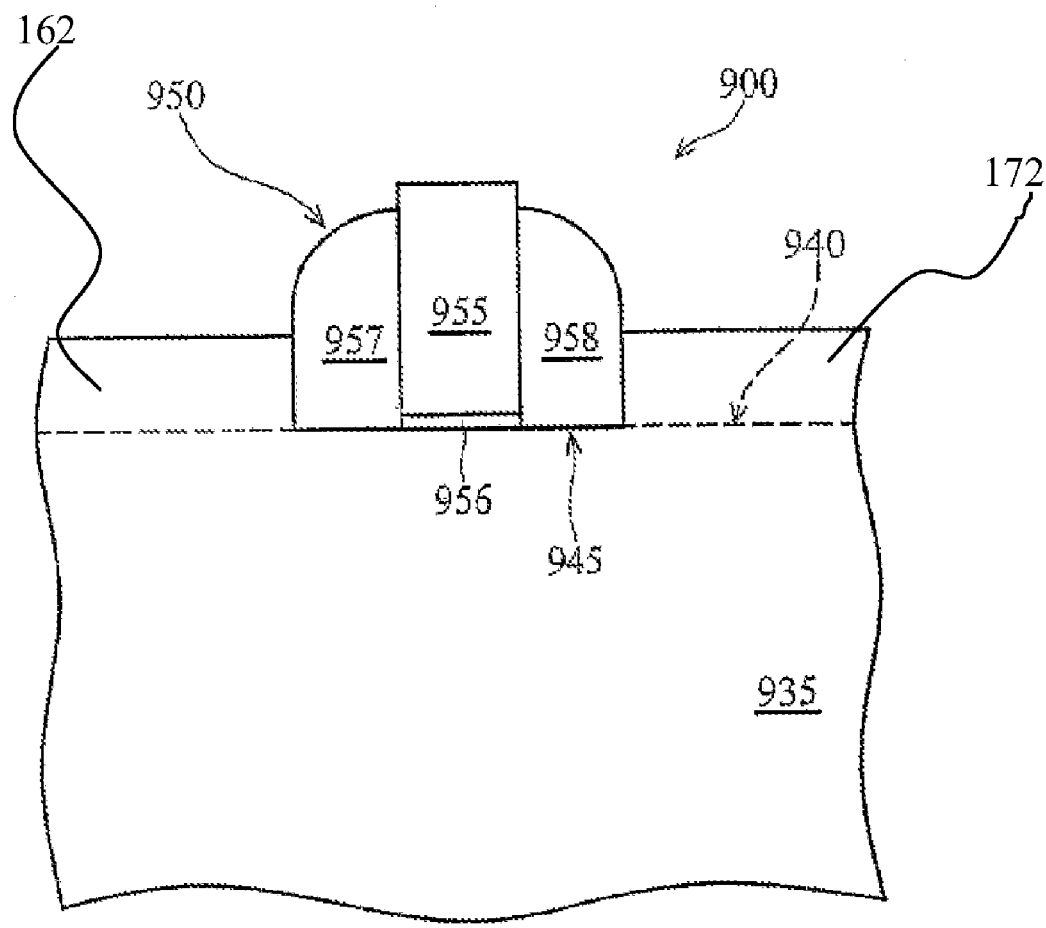

In accordance with this embodiment of the present invention, at this stage a source region rise 162 and a drain region rise 172 are created, preferably by an epitaxial growth process. Note that while these extension regions are separately referred to, they in effect will be a part of the source and drain regions that will also include portions of the substrate 935. The resulting configuration is illustrated in FIG. 9c. The substrate surface 940 prior to formation of the source region rise 162 and drain region rise 172 is shown in FIG. 9c by a broken line.

Figure 9D:
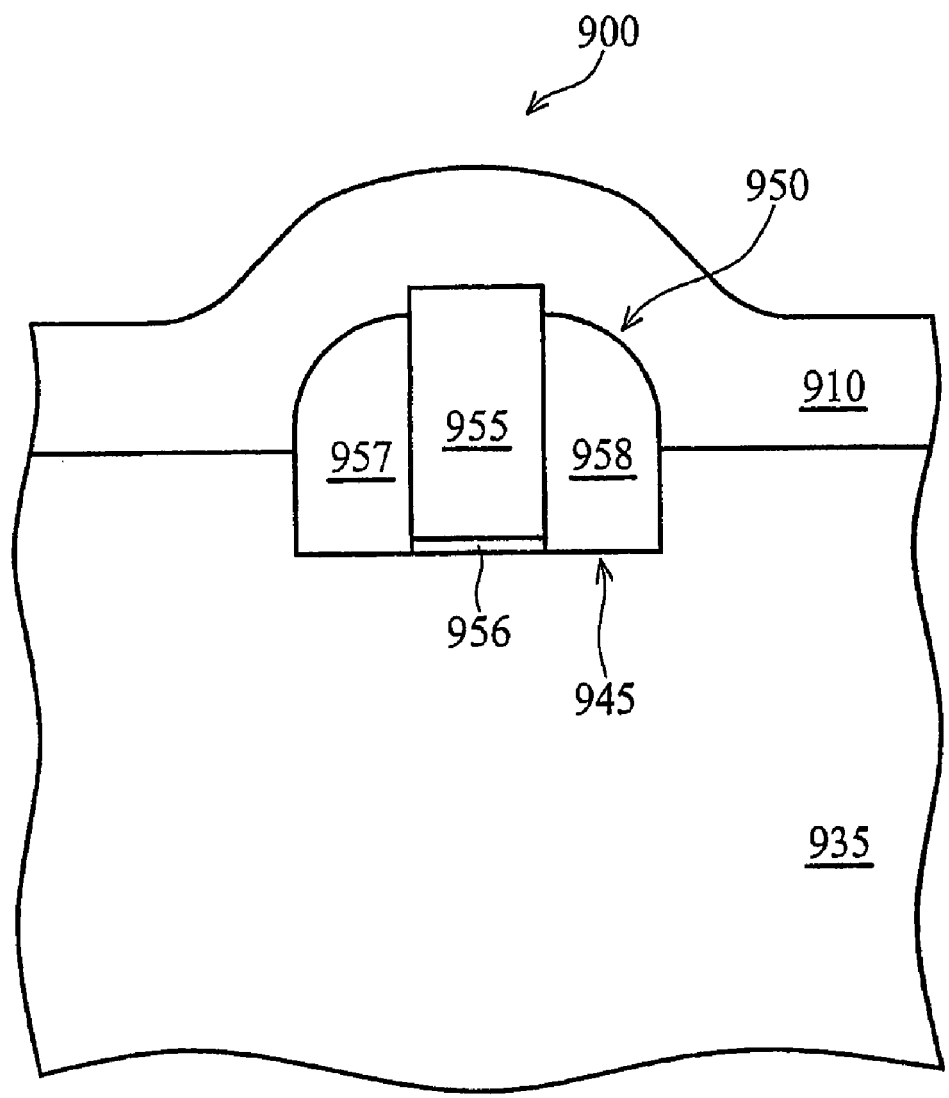

In this embodiment, the source region and the drain region are now tapered, starting with the formation of a profiling layer 910, which is formed over the gate structure and the adjacent area that will become the source and drain regions. The position of the profiling layer 910 in the partially-fabricate semiconductor device 900 is shown in FIG. 9d. In accordance with this embodiment of the present invention, this profiling layer could be an oxide or a photoresist material.

Figure 9E:
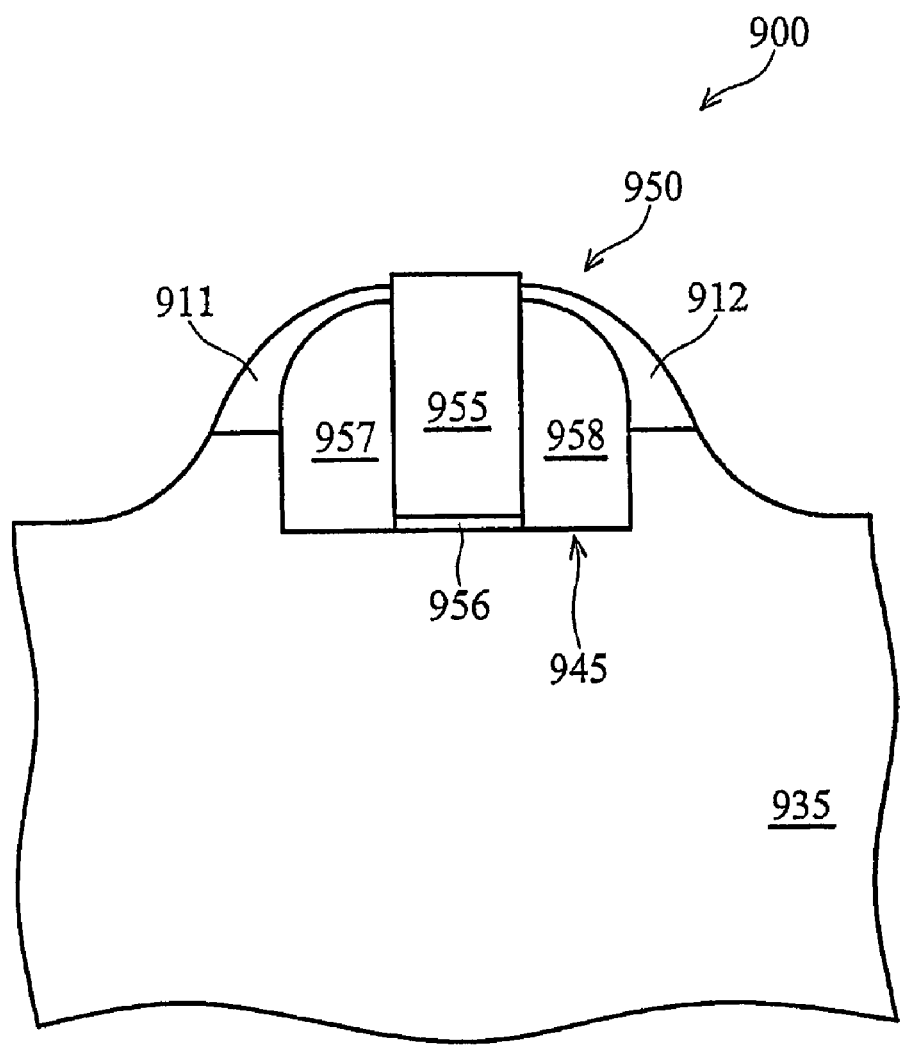
Figure 9F:
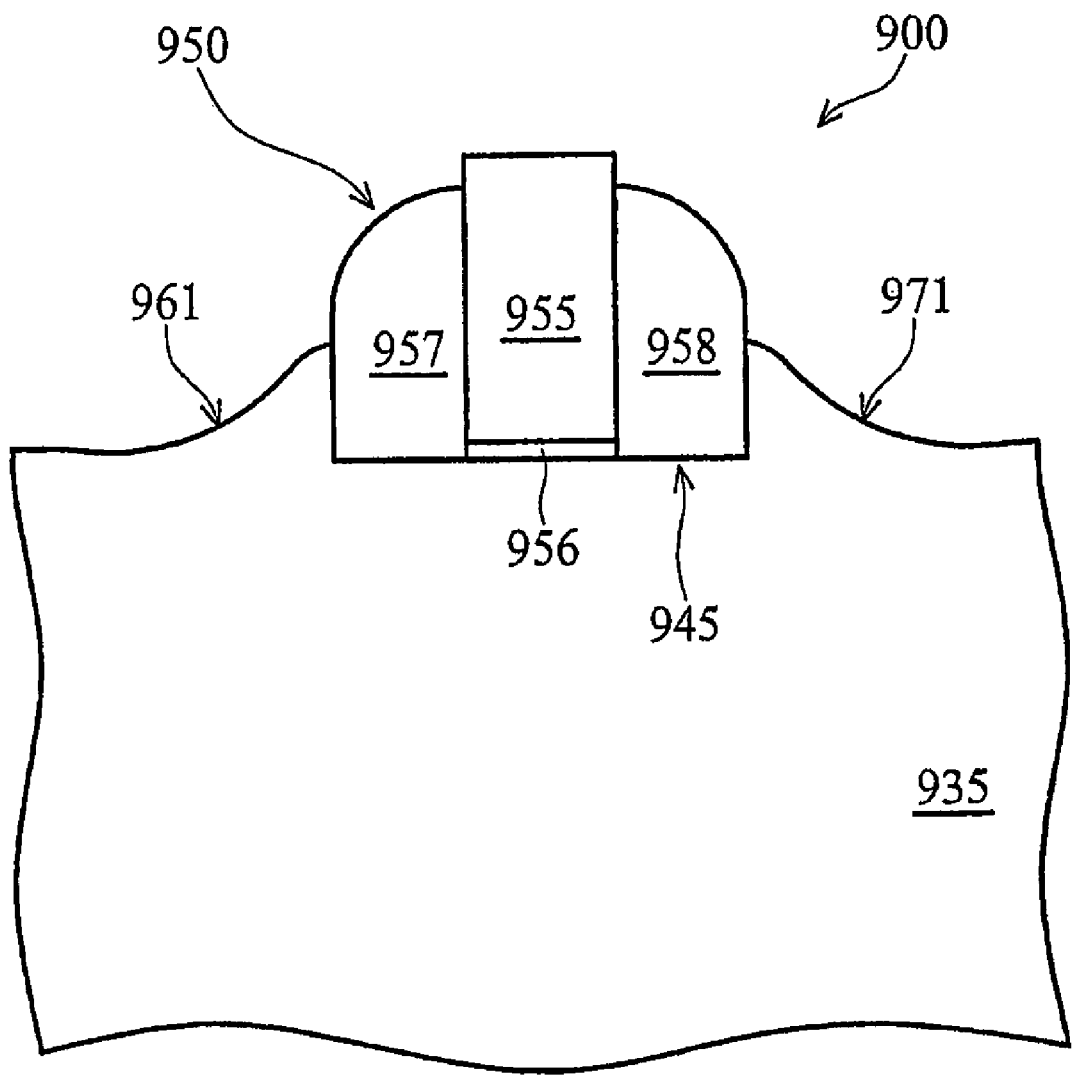

Once the profiling layer has been formed, a first dry etch is performed to eliminate the profiling layer except for a pair of side walls; the first sidewall 911 being disposed on the source region side of gate structure 950 and second sidewall 912 being adjacent to the drain region side of the gate structure. The two sidewalls, which are formed of the material of layer 910 that still remains, together substantially or completely cover the gate structure 950, as shown in FIG. 9e. A second dry etch is then performed until the sidewalls 911 and 921 have been further reduced or eliminated, as illustrated in FIG. 9f. Note that in this second dry etch process, "rise" portions defined by upper boundaries 961 and 971 of the regions that will become the source and the drain (and perhaps a portion of the original substrate) are also in part etched away—with those portions of the source and drain region farthest from the gate structure being etched most deeply.

Figure 9G:
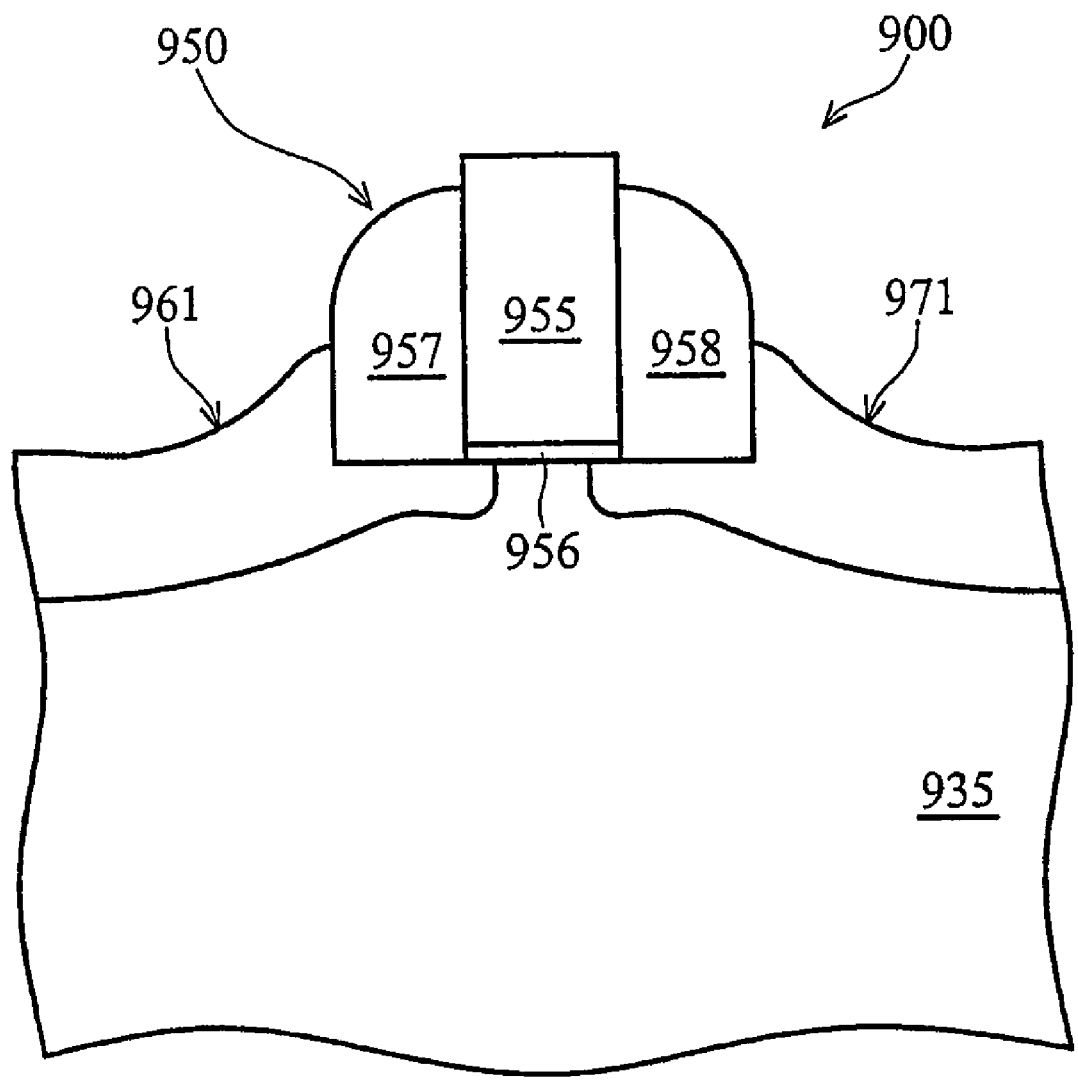

In this embodiment, in-situ doping by ion implantation is now performed, resulting in the source and drain profiles shown in FIG. 9g. As alluded to above, this process is expected to result in less dopant encroachment during this ion implantation process, and reduces the need for a packet or channel implant. This means that the electric field will be reduced for a given DIBL level. Significantly, the junction leakage should be substantially reduced. This is especially of advantage in devices with a high threshold voltage, where junction leakage is a dominant leakage source. In alternate embodiments (not shown), either the source region or the drain region, or both, may be formed by in-situ doping during an epitaxial growth process.

Figure 10A:
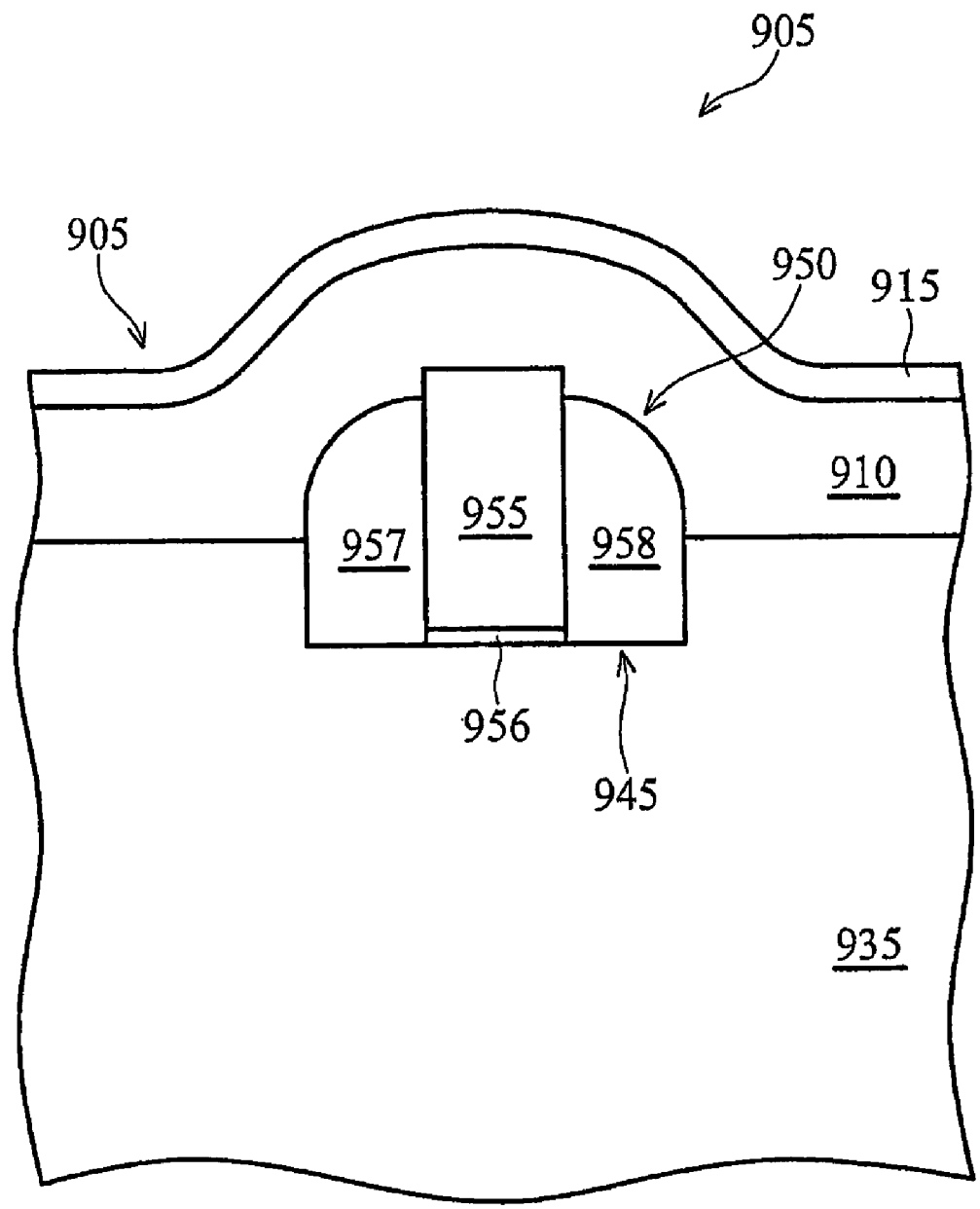
FIGS. 10a through 10f are a series of cross-sectional side views illustrating a gated-diode semiconductor device at selected stages of fabrication according to an alternate embodiment of the present invention.

FIGS. 10a through 10f are a series of cross-sectional side views illustrating a gated-diode semiconductor device 905 at selected stages of fabrication according to an alternate embodiment of the present invention. The starting point for the process of this embodiment is illustrated by FIG. 9d, where a profiling layer 910 has been formed on the gate structure 950 and the portions of substrate 935 that surround it. A second profiling layer 915 is then formed on the profiling layer 910, as illustrated in FIG. 10a. The second profiling layer 915 may be formed of a variety of materials, but should have a good etch-sensitivity to the underlying profiling layer 910.

Figure 10B:
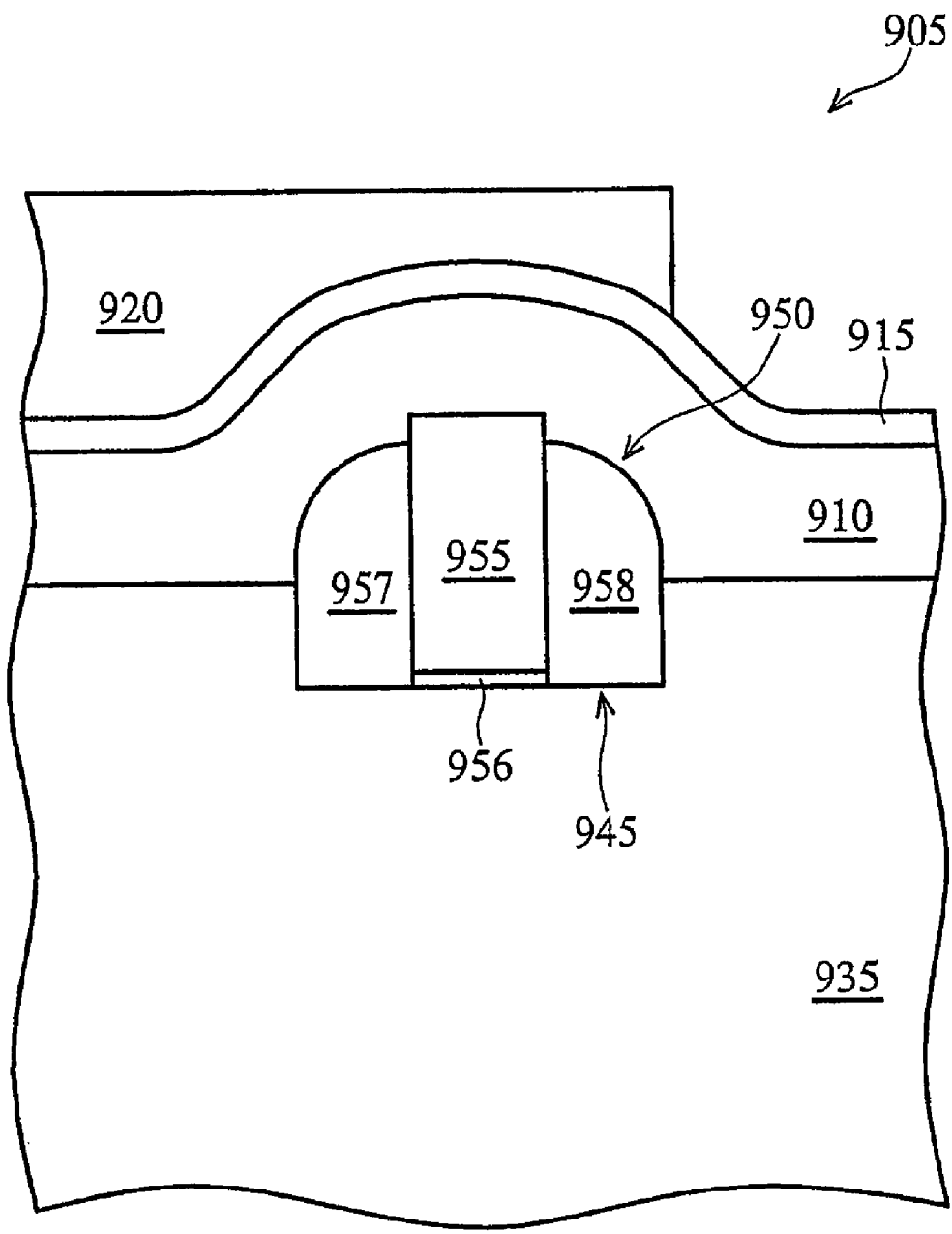
Figure 10C:
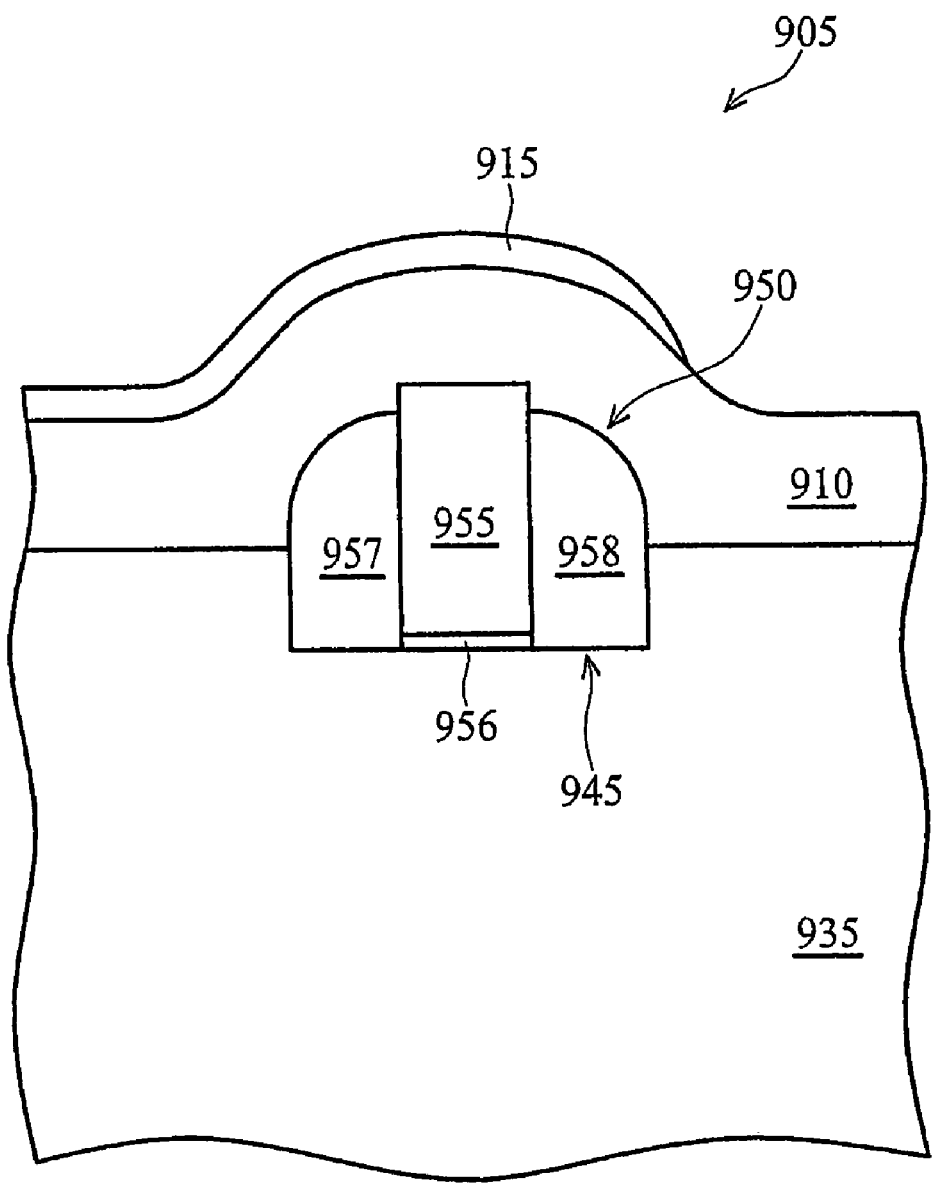
Figure 10D:
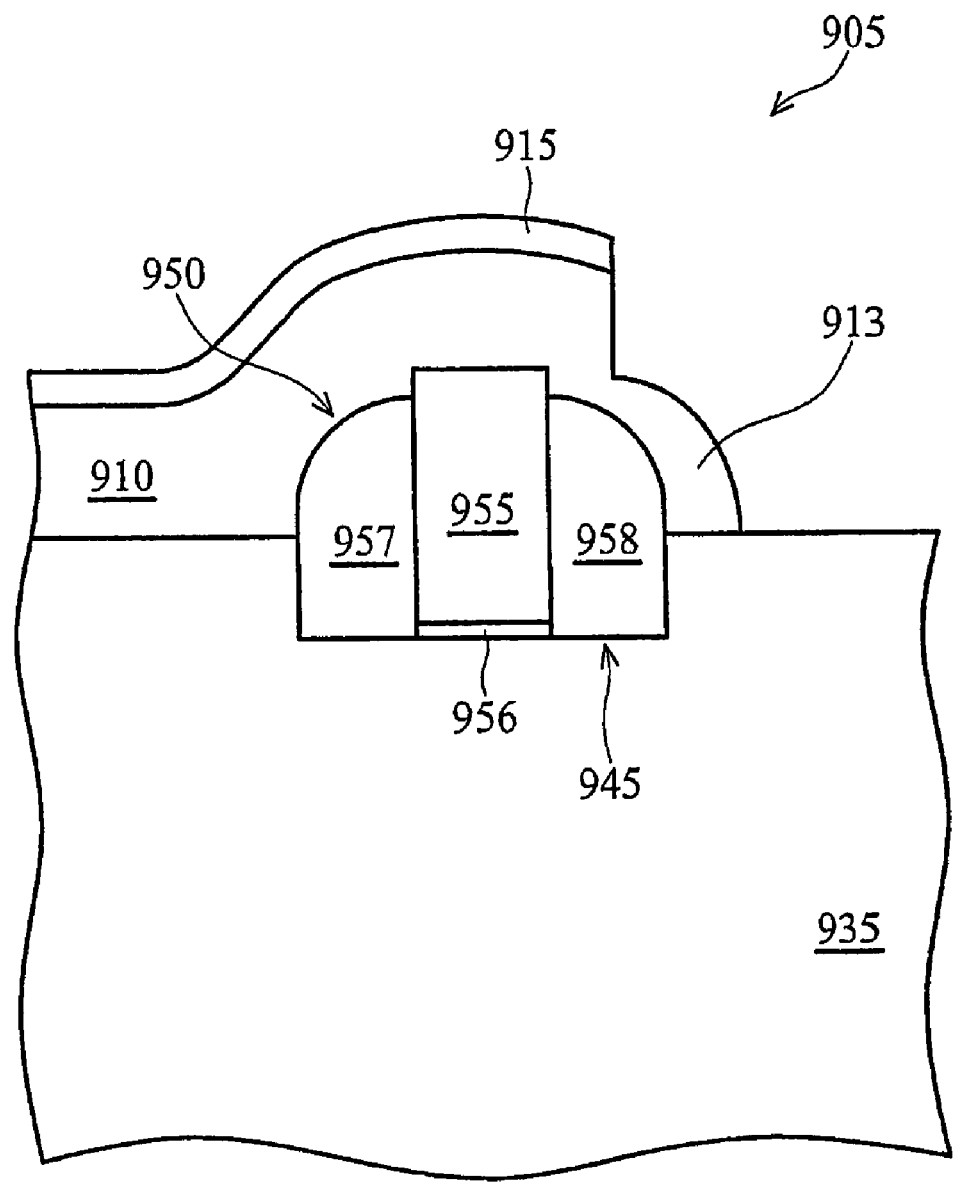

In this embodiment a layer of photoresist is then applied and patterned to form a photoresist structure 920, as illustrated in FIG. 10b. As may be seen there, the photoresist structure 920 basically covers the gate structure 950 and the overlying layers above it and to one side, leaving a portion of the second profiling layer 915 exposed. A first dry etch may then be performed to remove the exposed portion of the second profiling layer 915. Using an appropriate solvent, the photoresist structure is also removed, resulting in the configuration shown in FIG. 10c. A second dry etch is then performed until much of the portion of profiling layer 910 that is not protected by the second profiling layer 915 has been removed, leaving only sidewall 913, as illustrated in FIG. 10d.

Figure 10E:
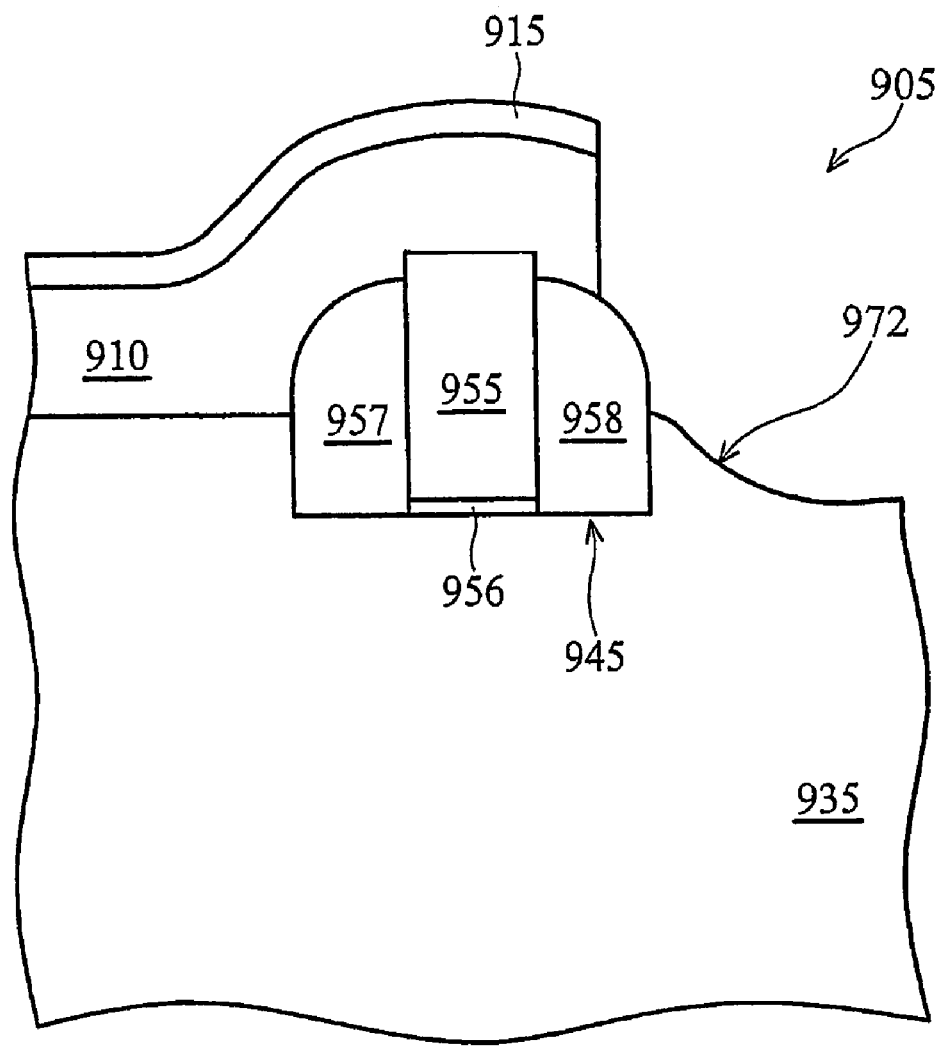
Figure 10F:
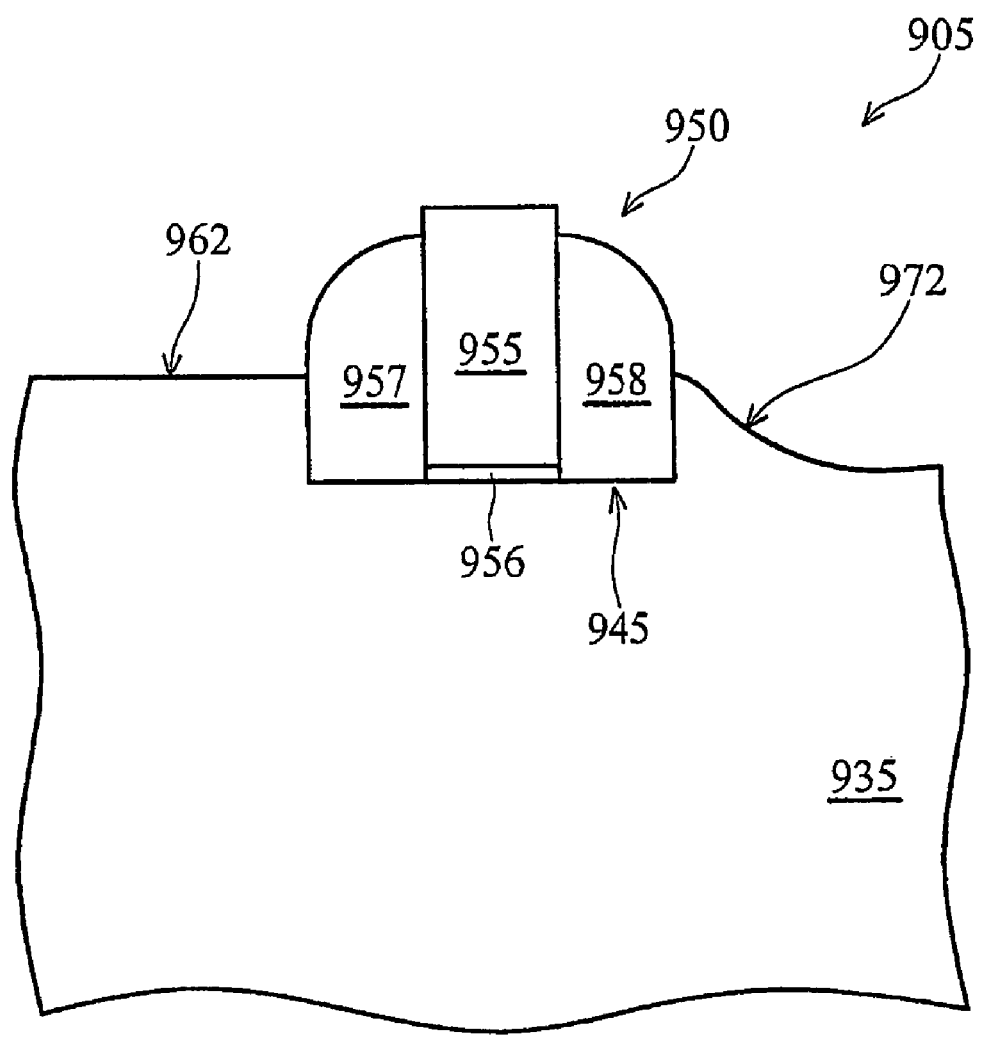

A third dry etch may then be used (or the second dry etch continued) until the sidewall 913 is mostly or completely removed. This etching will also remove a portion of the underlying substrate "rise" portion (and perhaps a part of the original substrate itself); to leave a tapered upper boundary 972, as is illustrated in FIG. 10e. Finally, the remaining portions of profiling layer 910 and secondary profiling layer 915 are removed, as illustrated in FIG. 10f, leaving the exposed gate structure 950 adjacent to upper boundary 972 on one side and upper boundary 962 on the other. Ion implantation may then be performed (step not shown) for form the source and drain regions having a junction profile dictated in part by the shape of the upper boundary above them. Note that in this embodiment, the source region may be on either side of the gate structure.

Although the present invention and its advantages have been described in detail, it should be understood that various changes, substitutions and alterations can be made herein without departing from the spirit and scope of the invention as defined by the appended claims. For example, the difference in elevation between the lower boundary of the gate structure and the upper boundary of an adjacent source region or drain region may be accomplished in whole or in part through the use of a recessed channel region. That is, the dimensions $d_S$ or $d_D$, or both, may be increased by disposing the lower boundary of the gate structure below the top surface of the substrate instead of, or in addition to, locally raising the surface of the substrate.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
   a substrate;
   a gate structure formed on the substrate and having a lower boundary adjacent the substrate; and
   a source region having a sloped upper boundary formed adjacent the gate structure, wherein the source region upper boundary is higher in elevation than the lower boundary of the gate structure;
   further comprising a drain region having a sloping upper boundary that is higher than the lower boundary of the gate structure, the source region and the drain region being disposed substantially on opposite sides of the gate structure, the source and drain regions having upper boundaries at different elevations;
   wherein the semiconductor device is a gated diode.

2. The semiconductor device of claim 1 wherein the highest elevation of the source region upper boundary is adjacent the gate structure.

3. The semiconductor device of claim 1, wherein the upper boundary of the source region is at its highest elevation about 200 Å above the lower boundary of the gate structure.

4. The semiconductor device of claim 1, wherein the upper boundary of the source region is at its highest elevation about 400 Å above the lower boundary of the gate structure.

5. The semiconductor device of claim 1, wherein the upper boundary of the source region is downwardly sloping.

6. The semiconductor device of claim 5, wherein the upper boundary of the source region slopes at an angle of about 15° relative to the substrate surface.

7. The semiconductor device of claim 1, wherein the drain region upper boundary is at its highest elevation about 200 Å above the lower boundary of the gate structure.

8. The semiconductor device of claim 1, wherein the upper boundary of the source region is at its highest elevation about 400 Å above the lower boundary of the gate structure, and wherein the upper boundary of the drain region is at its highest elevation about 200 Å above the lower boundary of the gate structure.

* * * * *